United States Patent
Tseng et al.

(10) Patent No.: US 7,939,434 B2
(45) Date of Patent: *May 10, 2011

(54) METHOD FOR FABRICATING POLYSILICON FILM

(75) Inventors: Chih-Yuan Tseng, Hsinchu (TW); I Hsuan Peng, Hsinchu County (TW); Yung-Hui Yeh, Hsinchu (TW); Jung-Jie Huang, Yulin County (TW); Cheng-Ju Tsai, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 144 days.

This patent is subject to a terminal disclaimer.

(21) Appl. No.: 12/116,017

(22) Filed: May 6, 2008

(65) Prior Publication Data
US 2009/0020790 A1 Jan. 22, 2009

(30) Foreign Application Priority Data
Jul. 17, 2007 (TW) .............................. 96125973 A

(51) Int. Cl.
*H01L 21/20* (2006.01)
*H01L 21/26* (2006.01)

(52) U.S. Cl. ........ 438/485; 438/647; 438/680; 257/382; 257/412

(58) Field of Classification Search .................. 257/382, 257/385, 412, 756; 438/647, 657, 485, 488, 438/680, 684, FOR. 351; 117/88, 900
See application file for complete search history.

(56) References Cited

U.S. PATENT DOCUMENTS

| 4,872,043 | A | * | 10/1989 | Fujii | 257/245 |
| 5,888,414 | A | * | 3/1999 | Collins et al. | 216/68 |
| 6,548,380 | B1 | * | 4/2003 | Goto et al. | 438/485 |
| 2007/0077735 | A1 | * | 4/2007 | Peng et al. | 438/486 |
| 2007/0105373 | A1 | * | 5/2007 | Wang et al. | 438/680 |
| 2008/0188062 | A1 | * | 8/2008 | Chen et al. | 438/483 |
| 2009/0155988 | A1 | * | 6/2009 | Peng et al. | 438/486 |

FOREIGN PATENT DOCUMENTS
JP 2004-055895 2/2004
TW 200719411 A 5/2007

OTHER PUBLICATIONS
H. Pierson "Handbook of Chemical Vapor Deposition (CVD). Principles, Technology and Application. 2nd Edition", (C) 1999, Noyes Publications.*

* cited by examiner

*Primary Examiner* — Fernando L Toledo

(57) ABSTRACT

A method of directly depositing a polysilicon film at a low temperature is disclosed. The method comprises providing a substrate and performing a sequential deposition process. The sequential deposition process comprises first and second deposition steps. In the first deposition step, a first bias voltage is applied to the substrate, and plasma chemical vapor deposition is utilized to form a first polysilicon sub-layer on the substrate. In the second deposition step, a second bias voltage is applied to the substrate, and plasma chemical vapor deposition is utilized to form a second polysilicon sub-layer on the first sub-layer. The first and second sub-layers constitute the polysilicon film, and the first bias voltage differs from the second bias voltage.

8 Claims, 4 Drawing Sheets

METHOD FOR FABRICATING POLYSILICON FILM

BACKGROUND OF THE INVENTION

1. Field of the Invention

The present invention relates to a polysilicon film and fabrication methods thereof, and in particular relates to directly fabricating a polysilicon film at a low temperature and a plasma chemical vapor deposition apparatus utilized.

2. Description of the Related Art

Currently, Solid Phase Crystallization or Excimer Laser Annealing (ELA) methods are utilized to form a polysilicon thin-film, such that the amorphous silicon on a thin film is crystallized into polysilicon by high temperature annealing. However, both processes have disadvantage.

For Solid Phase Crystallization, a silicon wafer or Quartz (SiO3) must be utilized as a substrate due to requirement for a high crystallization temperature. Because the required materials are relatively expensive, they are not suitable for mass production.

As for Excimer Laser Annealing, although crystallization temperature may be reduced, the cost of required apparatuses is relatively high. In addition, time required for the procedure is less to be desired.

Additionally, in recent years, Plasma Enhanced Chemical Vapor Deposition (PE-CVD) and Hot Wire Chemical Vapor Deposition (HW-CVD) have been developed as direct deposition methods for forming polysilicon thin film. Nevertheless, during the preliminary stage of polysilicon thin film deposition, the nucleation density is relatively low, requiring several thousands Armstrong (>1000 Å) to be deposited to form polysilicon thin film of desired crystallization. Specifically, disorder arrangement of silicon atoms takes place at the interface.

In addition to the direct deposition methods, Metal-Induced Lateral Crystallization (MILC) has been developed to deposit a relatively thinner layer of polysilicon at a slower speed, to be used as a seed layer for subsequent deposition of amorphous silicon. The speed of gas flow utilized in depositing the polysilicon is slower than that normally used in depositing the amorphous silicon by several folds. After the polysilicon has been deposited, amorphous silicon is deposited on the polysilicon to an appropriate thickness and is annealed in a furnace at 600° C., so that the amorphous silicon is crystallized into polysilicon. Since the seed layer already exists, the amorphous silicon can be transformed into polysilicon in a relatively short period of time. However, since it takes a long time to form the seed layer at a slower speed, there is relatively little time savings for the anneal process. Furthermore, the method does not suit mass production due to process challenges involved given the overly high co-melting point of metal and silicon and problems of contamination of the thin film by the metal. In addition, outcome of an overly high temperature of the substrate due to seed layer application may lead to additional processing problems and challenges.

BRIEF SUMMARY OF THE INVENTION

An embodiment of a method for directly depositing a polysilicon film at a low temperature is disclosed. The method comprises providing a substrate and performing a sequential deposition process. The sequential deposition process comprises first and second deposition steps. In the first deposition step, a first bias voltage is applied to the substrate, and plasma chemical vapor deposition is utilized to form a first sub-layer of polysilicon on the substrate. In the second deposition step, a second bias voltage is applied to the substrate, and plasma chemical vapor deposition is utilized to form a second sub-layer of polysilicon on the first sub-layer. The first and second sub-layers constitute the polysilicon film. Specifically, the first bias voltage differs from the second bias voltage.

An embodiment of a low temperature polysilicon thin film transistor (TFT) electronic device is also disclosed. The electronic device comprises a substrate, a gate electrode on the substrate, and a polysilicon thin film which is formed by the described method and overlies the gate electrode.

An embodiment of a plasma chemical vapor deposition apparatus is also disclosed. The vapor deposition apparatus is used to deposit a low temperature polysilicon thin film on a substrate, and comprises a vacuum chamber used to accommodate more than one type of injected gases. The vacuum chamber is provided with a support stand used to place the substrate, and the injected gas contains a silicon material. The vapor deposition apparatus also comprises an induction coil disposed outside the vacuum chamber. The induction coil is used to generate an induction-coupled electrical field in the vacuum chamber, so that the gas in the vacuum chamber is reacted and transformed into plasma, which is deposed on the substrate. The vapor deposition apparatus comprises an integrated bias system including a direct current (DC) bias voltage supply and an radiation frequency (RF) bias voltage supply, electrically connected to the support stand. The integrated bias system is used to alternatively supply a bias voltage to the substrate that is on the support stand.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Hereinafter, the term "integrated bias system" refers to an integrated bias system combining a direct current (DC) bias voltage supply and a radio frequency (RF) voltage supply.

Exemplary Example

Figure 1:
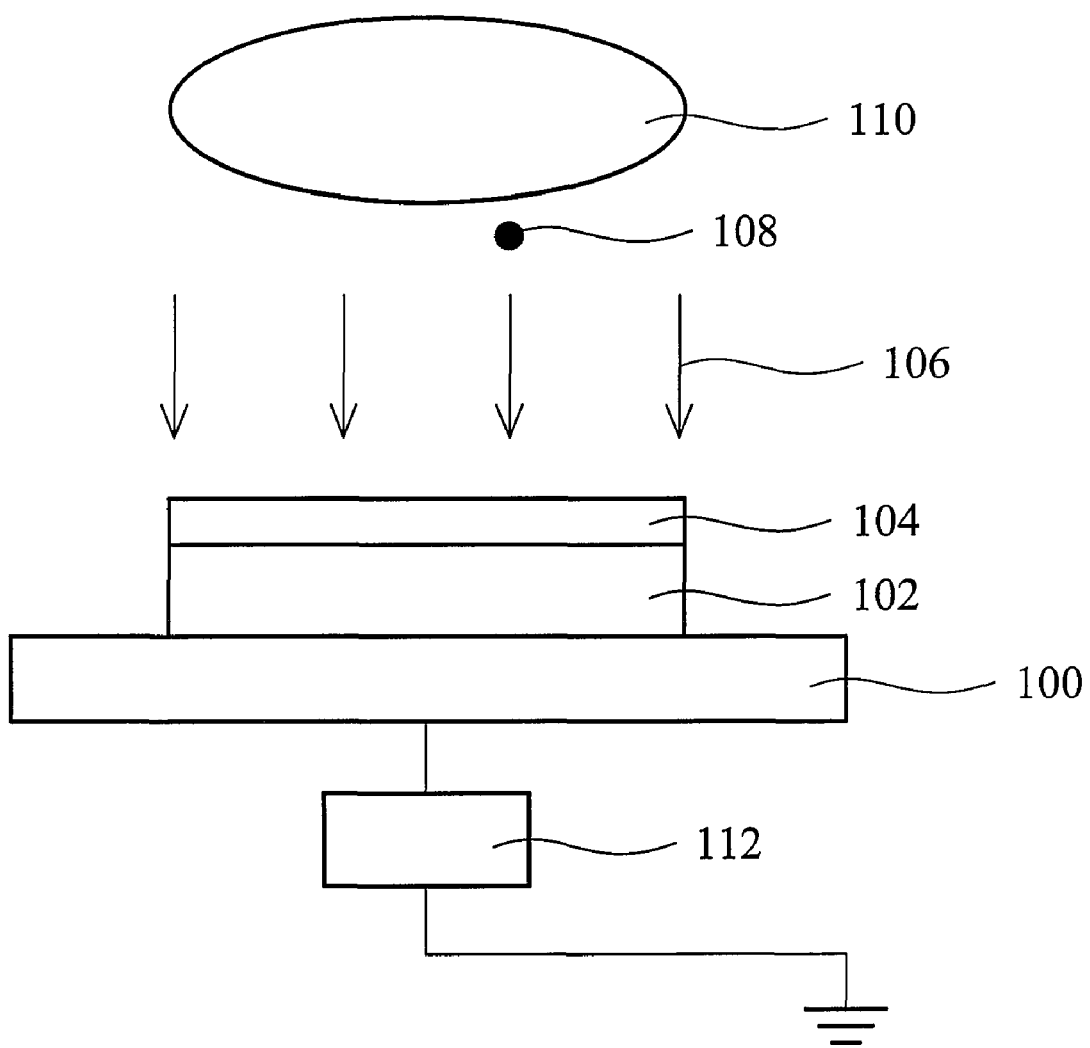
FIG. 1 is a schematic view showing a comparative example of a direct current (DC) bias system with high density plasma.

Referring to FIG. 1, in this example, high density plasma chemical vapor deposition is utilized to directly fabricate a polysilicon film at a low temperature.

Firstly, a substrate 102 is disposed on the support stand 100, and an induction layer 104 is deposited on the substrate 102. A gas including silicon (not shown) to generate plasma 110 is introduced, in the meantime, a bias system 112 is utilized to apply a DC bias voltage to the substrate 102, thereby a polysilicon layer is formed through induction of induction layer 104 coupled with plasma chemical vapor deposition. Ions 108 from plasma 110 are influenced by the DC bias voltage, thus bombarding the substrate 102 in the direction 106 and depositing on the substrate 102. In this example, the formation method for the induction layer can be chemical vapor deposition, physical vapor deposition, or atomic layer deposition, and materials thereof can be aluminum nitride. Formation methods of the polysilicon layer can be inductively-coupled plasma chemical vapor deposition or very high frequency chemical vapor deposition.

As described, this example features the direct deposition of polysilicon (thin) film at a low temperature by inductively-coupled plasma chemical vapor deposition coupled with a DC bias voltage. During the deposition process, however, issues such as a loose structure and bad crystalline usually occur because of ion or atom bombardment of the underlying layer.

First Embodiment

In this embodiment, the issues described in the exemplary example are addressed through application of RF bias voltage, specifically, via appropriate switching of DC and RF bias voltages during the early process stage (or so-called nuclear formation stage). The application allows avoidance of over bombardment effects during the nuclear formation stage, resulting in obtainment of stable high density plasma. Next, in the propagation stage, DC bias voltage is applied, effectively enhancing the deposition rate and stability of crystalline. It is important to note, that compared to the exemplary example in which only DC bias voltage is employed in the entire process, this embodiment utilizes an integrated bias system to apply different bias voltages at different processing stages. In doing so, the electrical field reversal property of RF bias voltage not only results in extension of mean free path of charged particles in the plasma region, but also reduces bombarding effects of plasma to the substrate. Accordingly, plasma density is increased, and bombarding effects to the substrate can be avoided, resulting in a denser polysilicon film and enhanced crystalline. Thereafter, in the propagation stage, DC bias voltage is applied, effectively enhancing the deposition rate and stability of crystalline. In another embodiment, an additional deposition step is further performed after the previously described sequential deposition steps. In the additional deposition step, RF bias voltage is applied to the substrate again, and a plasma chemical vapor deposition is utilized to sequentially deposit polysilicon materials on the substrate up to a preferred thickness, resulting in a polysilicon film. A silicon nitride layer is then formed on the polysilicon film.

Figure 2A:
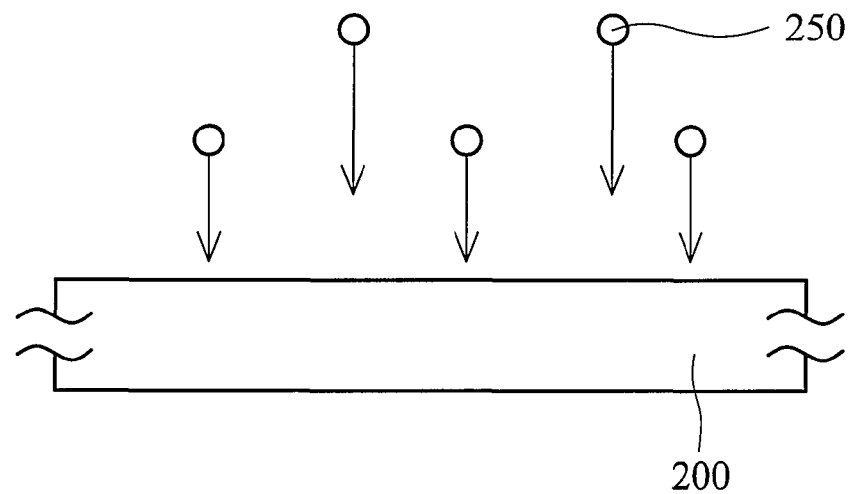
FIG. 2a is a schematic view showing a motion mode of charged particles in a DC bias field.
Figure 2B:
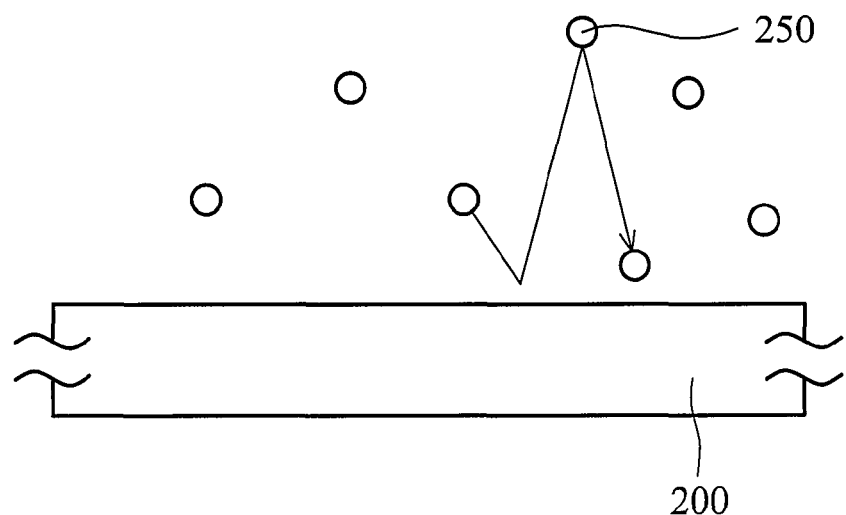
FIG. 2b is a schematic view showing a motion mode of charged particles in an RF bias field.
Figure 3:
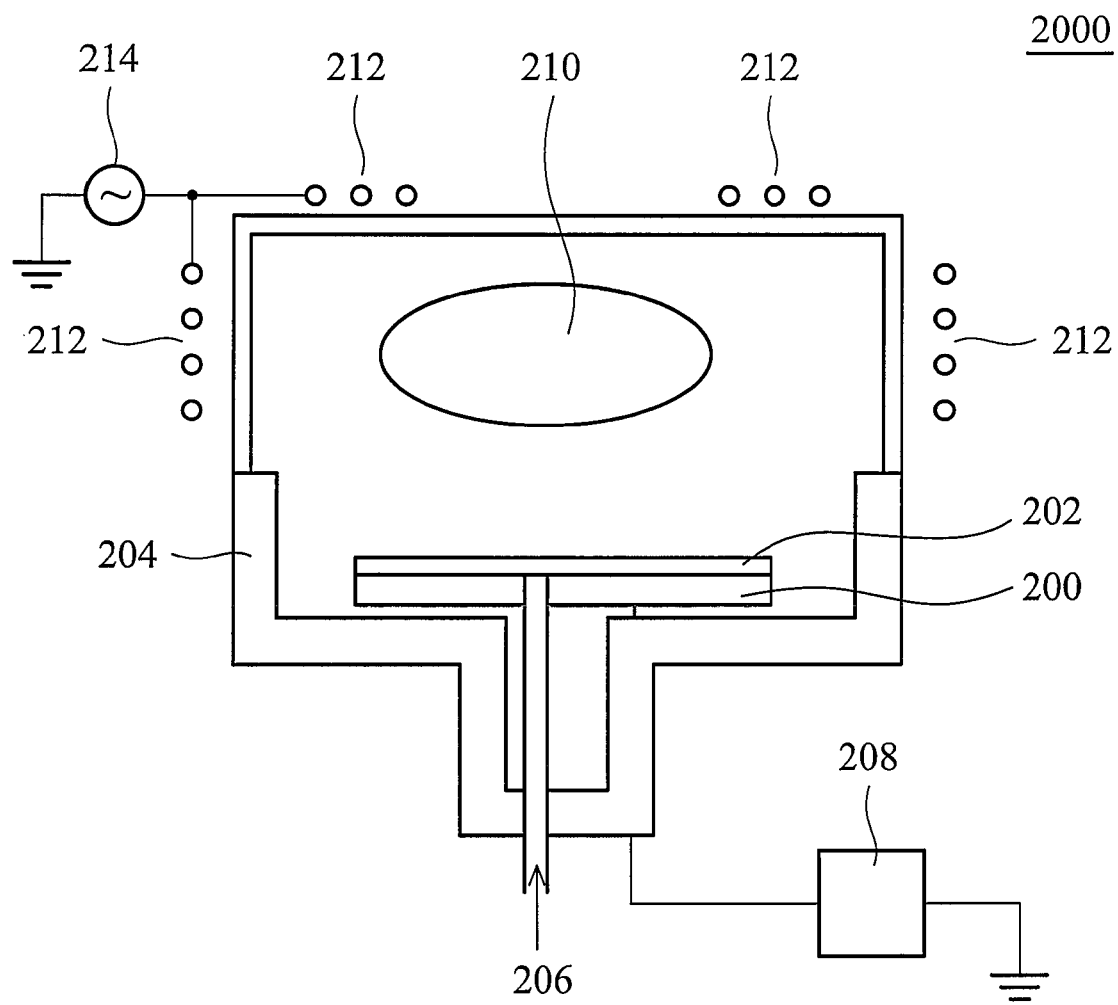
FIG. 3 is a schematic view showing an embodiment of a DC bias system with high density plasma.
Figure 4:
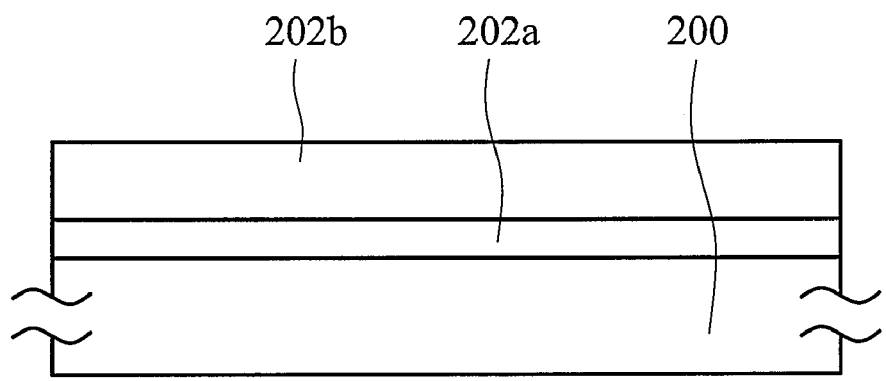
FIG. 4 shows the polysilicon film formed by the system in FIG. 3.

Referring to FIGS. 2-4, FIG. 2a is a schematic view showing a motion mode of charged particles 250 in a DC bias field; FIG. 2b is a schematic view showing a motion mode of charged particles 250 in an RF bias field; FIG. 3 is a schematic view showing an embodiment of a DC bias system accompanying with high density plasma; and FIG. 4 shows the polysilicon film formed by the system in FIG. 3.

As shown in FIG. 2a, the electric field generated by DC bias voltage forces charged particles 250 to strike the substrate at high speeds with conversion of kinetic energy to potential energy, thus facilitating reaction. As shown in FIG. 2b, by using RF bias voltage, the electrical field reversal property of RF bias voltage alters the motion mode of charged particles 250, thus increasing collision probability and duration of charged particles 250 in the plasma system. Resulting in increased plasma density so that reaction takes place faster.

As shown in FIG. 3, this embodiment discloses an inductively-coupled plasma chemical vapor deposition apparatus 2000 for deposition of a low temperature polysilicon thin film 202 on a substrate 200. The inductively-coupled plasma chemical vapor deposition apparatus 2000 mainly includes a vacuum chamber 204, an induction coil 212, an integrated bias system 208, an RF power 214, and a cooling gas 206.

The vacuum chamber 204 allows introduction of one or more gases (such as silane and argon), and possesses a support stand (not shown) for holding the substrate. The cooling gas 206, such as nitrogen, is utilized to control temperature of the substrate 200.

The induction coil 212 is disposed outside the vacuum chamber 204, and is connected to an RF power 214. The induction coil 212 is used to generate inductively-coupled electric field in the vacuum chamber 204, so that the gas in the vacuum chamber 204 forms plasma 210 and bombards the substrate 200, to finally deposit on the substrate 200.

Integrated bias system 208 simultaneously includes a DC bias voltage supply and an RF voltage supply, electrically connected to the support stand, for applying a bias voltage on the substrate 200 in turn.

Referring to FIGS. 3 and 4, in this embodiment, the inductively-coupled plasma chemical vapor deposition apparatus 2000 is employed to perform sequential deposition on the substrate 200 at a low temperature. Firstly, the induction coil 212 and RF power 214 are used to generate an inductively-coupled electric field and a high density plasma source (typically, argon), allowing the processing gas such as silane (not shown) form ion beams. Next, an RF bias voltage is applied to the substrate 200 using the integrated bias system 208, allowing the ion beams to deposit a seed layer 202a of a preferred thickness on the substrate 200. Subsequently, a DC bias voltage is applied to the substrate 200 via switching the integrated bias system 208, thus the deposition rate is increased to form a portion 202b. Accordingly, a polysilicon thin film 202 serving as an active layer is obtained. Although the resultant polysilicon thin film 202 includes the seed layer 202a (also called RF bias seed layer) formed during the nuclear formation stage and the portion 202b (also called DC bias crystalline layer) formed during the propagation stage, there is no obvious interface between the seed layer 202a and portion 202b because the sequential deposition processes is performed in the same reaction chamber. In other embodiments, after portion 202b achieves a certain thickness; the integrated bias system 208 can be switched again for various purposes. Alternatively, other deposition methods such as very high frequency plasma-enhanced chemical vapor deposition or electron cyclotron resonance plasma-enhanced chemical vapor deposition may be used.

Compared to the method that only uses DC bias voltage during the entire process, the method used in this embodiment results in a denser polysilicon film and more enhanced crystalline. The method used in this embodiment is also appropriate in formation of TFT devices.

Second Embodiment

Figure 5:
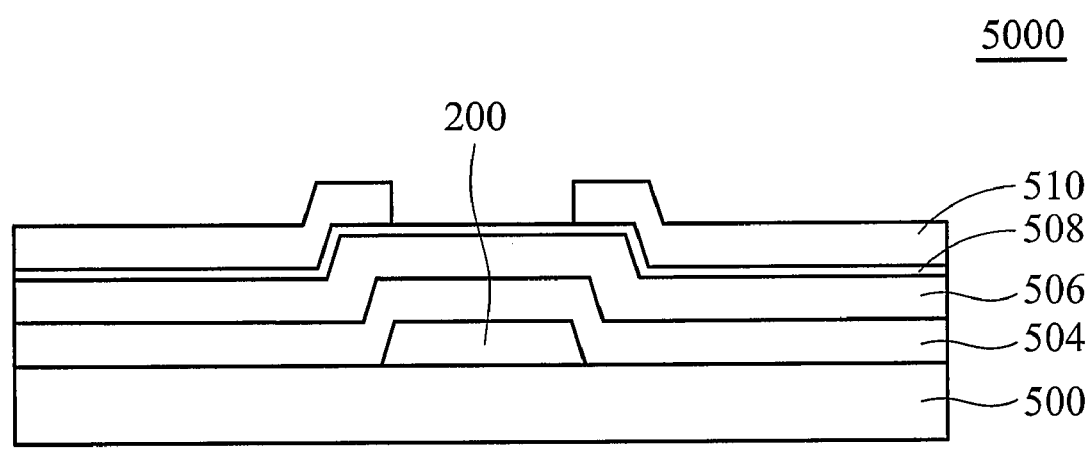
FIG. 5 shows a low temperature silicon thin film transistor 5000 including the polysilicon film shown in FIG. 4.

Referring to FIG. 5, the TFT process of this embodiment features direct formation of a micro-silicon active layer 506 and a micro-silicon doped layer 508 on a substrate with a gate electrode 502 and a gate dielectric layer 504 thereon by method of the previous described first embodiment. Subsequent conventional processes are then performed. Finally, a low temperature polysilicon TFT is obtained.

In the integrated bias system of this embodiment, energy generated from bombarding of ions is transmitted to atoms on the surface, resulting in diffusion of the atoms on the surface with sufficient energy to active sites. The diffused atoms sequentially form the insulating layer 504, micro-silicon active layer 506 and micro-silicon doped layer 508. When the micro-silicon doped layer 508 is formed on the active layer, a lightly doped junction (not shown) is formed on the interface, without additional ion implantation or thermal processes. In doing so, performance of devices is enhanced, and manufacturing costs are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of depositing a polysilicon film directly at a low temperature, comprising:
   providing a substrate; and
   performing a sequential deposition process, wherein the sequential deposition process comprises:
   a first deposition step in which a first bias voltage is applied to the substrate, wherein plasma chemical vapor deposition is utilized to form a first sub-layer of polysilicon on the substrate; and
   a second deposition step in which a second bias voltage is applied to the substrate, wherein plasma chemical vapor deposition is utilized to form a second sub-layer of polysilicon on the first sub-layer;
   wherein the first and second sub-layers constitute the polysilicon film, and wherein the first bias voltage differs from the second bias voltage, and the second bias voltage is DC bias voltage.

2. The method as claimed in claim 1, wherein the first bias voltage is RF bias voltage.

3. The method as claimed in claim 1, wherein the plasma chemical vapor deposition is very high frequency plasma-enhanced chemical vapor deposition.

4. The method as claimed in claim 1, wherein the plasma chemical vapor deposition is electron cyclotron resonance plasma-enhanced chemical vapor deposition.

5. The method as claimed in claim 1, wherein the plasma chemical vapor deposition is inductively-coupled plasma-enhanced chemical vapor deposition.

6. The method as claimed in claim 5, wherein the process of the inductively-coupled plasma-enhanced chemical vapor deposition comprises the following steps:
   placing the substrate into a vacuum chamber;
   injecting a gas having a silicon material into the vacuum chamber;
   generating an inductively-coupled electrical field in the vacuum chamber by utilizing an induction coil, thus allowing the gas to generate a high density plasma through the action of the inductively-coupled electrical field; and
   diffusing the high density plasma to the substrate, so that the polysilicon material is deposited on the substrate.

7. The method as claimed in claim 1, wherein the sequential deposition process further comprises:
   a third deposition step in which a first bias voltage is applied to the substrate, wherein plasma chemical vapor deposition is utilized to form a third sub-layer of polysilicon, and wherein the first, second and third sub-layers constitute the polysilicon film; and
   forming a silicon nitride on the polysilicon film.

8. The method as claimed in claim 7, wherein the first bias voltage is RF bias voltage.

* * * * *